(12) United States Patent
Callahan et al.

(10) Patent No.: US 7,598,163 B2
(45) Date of Patent: Oct. 6, 2009

(54) POST-SEED DEPOSITION PROCESS (76) Inventors: John Callahan, 99 Salem St., Wilmington, MA (US) 01887; John Trezza, 12 White Oak Dr., Nashua, NH (US) 03063

( * ) Notice: Subject to any disclaimer, the term of this patent is extended or adjusted under 35 U.S.C. 154(b) by 0 days.

(21) Appl. No.: 11/675,268

(22) Filed: Feb. 15, 2007

(65) Prior Publication Data

US 2008/0200022 A1  Aug. 21, 2008

(51) Int. Cl.
*H01L 21/44* (2006.01)
(52) U.S. Cl. .................. 438/597; 257/E21.586
(58) Field of Classification Search .......... 438/678, 438/597; 257/E21.586
See application file for complete search history.

(56) References Cited

U.S. PATENT DOCUMENTS

| | | | |
|---|---|---|---|
| 5,071,518 A | 12/1991 | Pan |
| 5,587,119 A | 12/1996 | White |
| 5,708,569 A | 1/1998 | Howard et al. |
| 5,814,889 A | 9/1998 | Gaul |
| 5,962,922 A | 10/1999 | Wang |
| 6,037,665 A | 3/2000 | Miyazaki |
| 6,314,013 B1 | 11/2001 | Ahn et al. |
| 6,316,737 B1 | 11/2001 | Evans et al. |
| 6,559,540 B2 | 5/2003 | Kawashima |
| 6,577,013 B1 | 6/2003 | Glenn et al. |
| 6,599,778 B2 | 7/2003 | Pogge et al. |
| 6,706,554 B2 | 3/2004 | Ogura |
| 6,740,576 B1 | 5/2004 | Lin et al. |
| 6,939,789 B2 | 9/2005 | Huang et al. |
| 7,157,310 B2 | 1/2007 | Benson et al. |
| 2001/0001292 A1 | 5/2001 | Bertin et al. |
| 2001/0033509 A1 | 10/2001 | Ahn et al. |
| 2001/0048166 A1 | 12/2001 | Miyazaki |
| 2002/0027441 A1 | 3/2002 | Akram et al. |
| 2002/0053726 A1 | 5/2002 | Mikubo et al. |
| 2003/0047799 A1 | 3/2003 | Cheever et al. |
| 2003/0080408 A1 | 5/2003 | Farnworth et al. |
| 2003/0206680 A1 | 11/2003 | Bakir et al. |
| 2004/0048465 A1* | 3/2004 | Ito ........................ 438/678 |
| 2004/0124523 A1 | 7/2004 | Poo et al. |

(Continued)

FOREIGN PATENT DOCUMENTS

EP   0 516 866   12/1992

(Continued)

OTHER PUBLICATIONS

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.

(Continued)

*Primary Examiner*—Asok K Sarkar (57) ABSTRACT

A method involves pattern etching a photoresist that is located on a wafer that contains a deposited seed layer to expose portions of the seed layer, plating the wafer so that plating metal builds up on only the exposed seed layer until the plating metal has reached an elevation above the seed layer that is at least equal to a thickness of the seed layer, removing the solid photoresist, and removing seed layer exposed by removal of the photoresist and plated metal until all of the exposed seed layer has been removed.

20 Claims, 6 Drawing Sheets

F)

U.S. PATENT DOCUMENTS

| | | |
|---|---|---|
| 2004/0207061 A1 | 10/2004 | Farrar et al. |
| 2004/0229456 A1* | 11/2004 | Andricacos et al. ......... 438/642 |
| 2004/0262635 A1 | 12/2004 | Lee |
| 2005/0064703 A1* | 3/2005 | Kondo et al. ................ 438/633 |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0146049 A1 | 7/2005 | Kripesh et al. |
| 2005/0167812 A1 | 8/2005 | Yoshida et al. |
| 2005/0179120 A1 | 8/2005 | Yamaguchi |
| 2006/0071347 A1 | 4/2006 | Dotta |
| 2006/0166498 A1 | 7/2006 | Kirby |
| 2006/0290002 A1 | 12/2006 | Arana et al. |

FOREIGN PATENT DOCUMENTS

| | | |
|---|---|---|
| EP | 0 757 386 A2 | 2/1997 |
| EP | 1 415 950 | 5/2004 |
| JP | 05243555 * | 3/1995 |

OTHER PUBLICATIONS

International Search Report, PCT/US06/23361, dated Sep. 19, 2007.

International Search Report for PCT/US06/23364, dated Nov. 13, 2006.

International Search Report for PCT/US06/23297, dated Jan. 3, 2007.

International Search Report and Written Opinion for PCT/US2008/053982 mailed Jun. 30, 2008.

* cited by examiner

POST-SEED DEPOSITION PROCESS

FIELD OF THE INVENTION

This invention relates to connections for chips and, more particularly, to formation of connections on such chips.

BACKGROUND

When making electrically conductive vias in a wafer of some kind (i.e. semiconductor, ceramic, polymer, etc.), electro- or electroless plating is often used. In such cases, in order to do so, it is necessary to deposit a thin seed layer that will form the base for the plating metal to build up on. Typically, this involves use of photolithography including application of a photoresist to the wafer, deposition of the seed, and removal of the photoresist. Most photoresist is applied as a viscous liquid, so it is difficult to precisely control the edges of where it should/should not be present. Thus, one of the byproducts of this approach and inaccuracy is a build up of excess seed metal during deposition of the seed layer near the edges of where the photoresist was. This excess seed metal is called overburden. This overburden can cause problems and thus, in most cases, must be removed through at least one additional processing step. In addition, the lack of precision control can lead to some photoresist entering a via, particularly when high density, narrow vias are involved. Wherever this happens, there will be no seed metal deposited for the plating to build up on or the overburden can cause unwanted short circuits.

Thus, there is a need for an approach that does not cause the aforementioned problems.

SUMMARY OF THE INVENTION

We have realized a method of performing seed deposition for plating purposes that does not suffer from the above problems.

One variant of the method involves pattern etching a photoresist that is located on a wafer that contains a deposited seed layer to expose portions of the seed layer, plating the wafer so that plating metal builds up on only the exposed seed layer, removing the solid photoresist, and removing seed layer exposed by removal of the photoresist and plated metal until all of the exposed seed layer has been removed.

Another variant of the method involves depositing a seed layer onto a wafer, applying a photoresist to the wafer on top of the seed layer, plating the wafer with a metal until the plating metal is in excess of a specified level by an amount at least equal to a thickness of the seed layer, removing the photoresist, and performing a seed etch on the wafer to remove the seed layer that was exposed by the removing of the photoresist.

Advantageously, the method can be readily used with and straightforwardly applied to the different via, routing and contact variants of U.S. patent application Ser. Nos. 11/329, 481, 11/329,506, 11/329,539, 11/329,540, 11/329,556, 11/329,557, 11/329,558, 11/329,574, 11/329,575, 11/329, 576, 11/329,873, 11/329,874, 11/329,875, 11/329,883, 11/329,885, 11/329,886, 11/329,887, 11/329,952, 11/329, 953, 11/329,955, 11/330,011 and 11/422,551, all of which are incorporated herein by reference as if fully set forth herein.

Moreover, the approach provides additional advantages and benefits. For example, the process provides, inter alia, at least one or more of three potential benefits: i) automatic formation of a reroute layer which can be used for connecting vias to other contacts, ii) eliminates the overburden at the edges of a via to allow for closer contacts and higher density, and iii) it can be used to form a contact for use in a post and penetration connection of either a post or a well.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

BRIEF DESCRIPTION OF THE DRAWINGS

This invention relates to capacitive sensors and, more particularly, to capacitive sensors for use in fingerprint detection.

FIGS. 3A through 3R illustrate, in simplified cross section and top view, a more complicated variant of the approach; and FIGS. 4A through 4M illustrate, in simplified cross section and top view, another variant of the approach.

DETAILED DESCRIPTION

FIGS. 1A through 1F show, in simplified form a general representation of two different effects that can be achieved using processes described herein. Note that, for purposes of illustration, the aspect ratios of the vias as well as other relative sizes have been distorted for purposes of presentation. Moreover, although illustrated with respect to a simple via, the process will work just as well with other via formation approaches including, for example, annular, coax, triax, backside, or other via formation methods that also involve narrow, deep vias (on the order of typically about between about 50 µm to about 5 µm, or even less than 5 µm wide, at a depth to width aspect ratio of about 4:1 to about 25:1) and can be readily performed through a contact or on some other part of a wafer.

FIGS. 1A through 1F illustrate, in simplified form a cross section of two slightly different example variants of a process that implements the invention.

Figure 1:
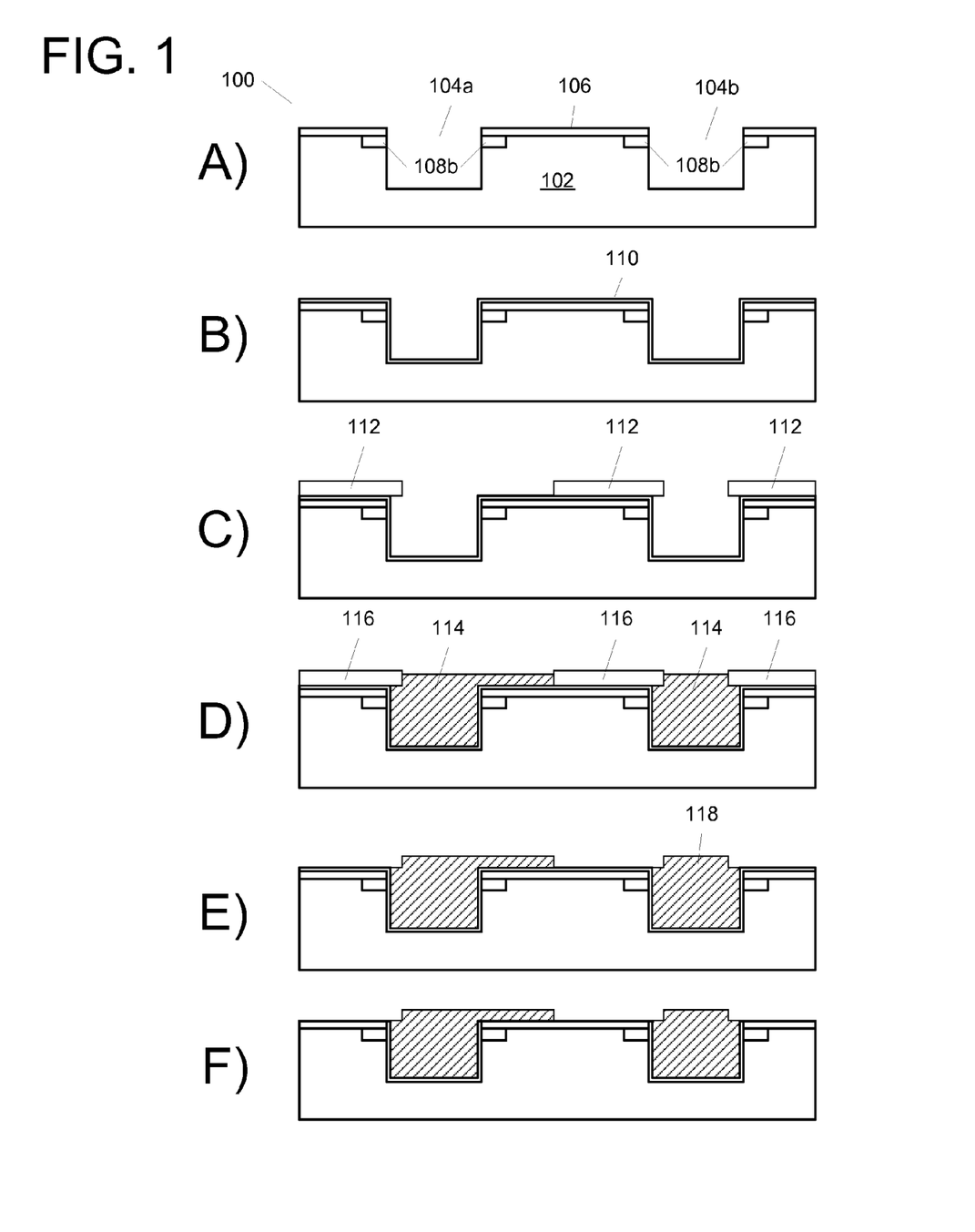
FIGS. 1A through 1F show, in simplified form, a general representation of the steps involved in two different aspects that can be achieved through the process described herein.

Initially, the wafer undergoes whatever processing it would receive up to the point where seed deposition would become the next step. This state is shown in FIG. 1A, which illustrates a portion 100 of a wafer 102 into which two vias 104a, 104b have been formed, in this case through the conventional cover glass 106 and contacts 108a, 108b. Then, the approach proceeds as follows:

First, as shown in FIG. 1B, a seed layer 110 is deposited with or without limited use of masking or photoresist (i.e. if used it is only on areas where it is important or desirable to do so for important protection purposes or some other reason).

Next, as shown in FIG. 1C, a photosensitive material 112 (i.e. photoresist) that can be pattern etched is put onto the top of the wafer 102 and, consequently, portions of the seed layer 110. This photosensitive material 112 is selected to be a material that will not be permitted to flow unrestricted into the vias 104a, 104b. Thus, the material will either be extremely viscous or else a solid or near-solid. As used throughout, for simplicity, the term "solid" is used to interchangeably connote any or all of the extremely viscous, near-solid or solid materials. Whatever material is used, it should be recognized that some creep down a portion of the sidewall of the via can be acceptable in some implementations. However, if such creep occurs, it should be kept small and the opening of the via should not be substantially obstructed or closed-off. In addition, it is desirable to keep the layer thin because the thickness of the layer, because it increases the height, affects the aspect ratio. In general, a photoresist thickness of about 40 µm or less is desirable, with thinner typically being better. Suitable "solid" materials are from the Riston® dry film photoresist line, commercially available from E. I. du Pont de Nemours & Co. Specifically, The Riston® PlateMaster, EtchMaster and TentMaster lines of photoresist at about, respectively, 38 µm, 33 µm and 30 µm in thickness can be used. Advantageously, through use of a photoresist product like Riston, is that it can be placed on the surface of the wafer as sheets and it has some rigidity. This rigidity means that the material 112 can be patterned in such a way that the material 112 can cover at least a portion of the opening of the via if desired—as will be seen below, an advantage in and of itself. Advantageously, this prevents, reduces or minimizes the situation where the edges of the via can have spiked plating due to the overburden that naturally forms on the surface of the wafer during plating.

As shown in FIG. 1C, the nature of the photoresist makes it possible to have it overhang or completely cover a portion of a via if this is desired. For example, as shown on the left side via 104a of FIG. 1C, the photoresist overhangs a portion of the left side and is substantially distanced from the right side, whereas for the via 104b on the right side of FIG. 1C, the photoresist overhangs the entire periphery of the via 104b.

Note that in both cases, the photoresist is placed on top of the prior-deposited seed layer 110.

Next, as shown in FIG. 1D, the wafer 102 is plated using conventional electro- or electroless plating, to build up, and to ideally fill, the vias 104a, 104b with metal 114 up to a level anywhere between a location above the seed layer, by an amount that is at least about the thickness of the seed layer, up to and including the level of the outer surface 116 of the photoresist 112. The reason for this typical range will be apparent from FIGS. 1E and 1F. Note that the top layer of the metal does not have to be plated to an even height—the center of a bottom-up filled via may be slightly lower, but will still be electrically connected to the seed material on the top surface of the wafer.

Next, as shown in FIG. 1E, the photoresist 112 is removed. Once can now immediately see from FIG. 1E, that the metal 114 of the left side via 104a has plated to form a routing trace as defined by the photoresist 112 and the metal 114 of the right side via 104a has plated to form an elevated area 118 that can serve, in whole or part, as a contact or post.

Of course, it should now be appreciated that the photoresist could be patterned to also allow overburden to form on certain parts of the wafer to automatically create a routing layer from the via to another location and, in some cases, along with traces formed by the overburden that can be used for moving signals from one location on the wafer to another for example, from a via to another location (as shown in FIG. 1E) or in some specified direction(s) so as to form a desired shape of metal 114 trace.

Finally, a seed removal process is employed, without generally protecting the traces formed by the overburden, to remove the seed layer exposed by removal of the photoresist. The result of this process is shown in FIG. 1F. As will now be appreciated, because the overburden in the typical case is at least about twice as thick as the seed layer and most often several times as thick or more, unprotected removal will not significantly or adversely affect the built up areas. In other words, both the seed and overburden built-up areas will be reduced in height by the thickness of the seed layer while leaving sufficient metal "overburden" in the desired locations.

Figure 2A:
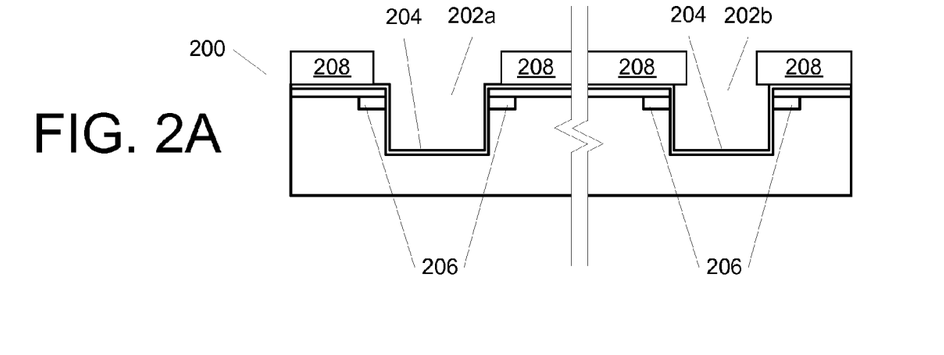
FIGS. 2A through 2C illustrate, in simplified form, how the technique of FIGS. 1A through 1F can be further used to form different types of contact structures.
Figure 2B:
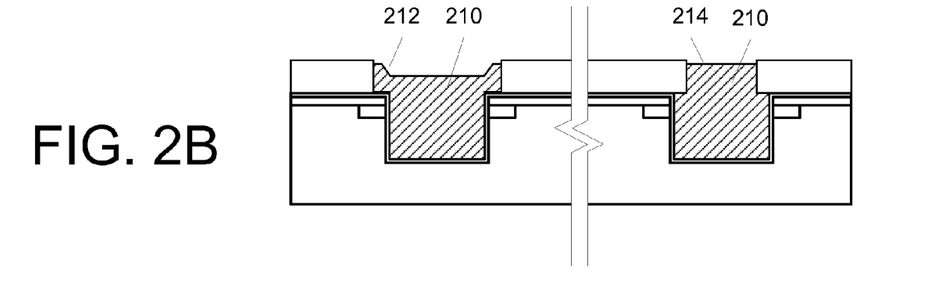
Figure 2C:
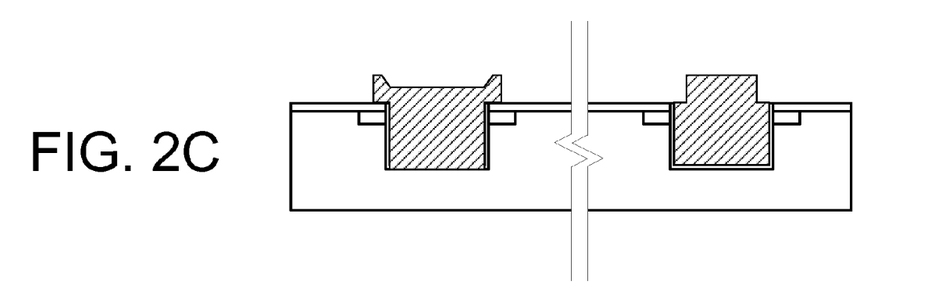

FIGS. 2A through 2C illustrate, in simplified form, how the foregoing technique can be further used to form different types of contact structures such as described in the applications referred to and incorporated above.

Initially, the wafer undergoes whatever processing it would receive up to the point where seed deposition would become the next step. FIG. 2A illustrates, in simplified cross section form, two portions 202a, 202b of a wafer 200 in which a seed layer 204 has been deposited into a via formed through a contact 206. As noted above, for purposes of explanation, the aspect ration of the via has been significantly distorted, but should be assumed in this example to have a width of about 25 µm and a depth to width aspect ratio of about 4:1. In addition, a photoresist 208, such as described above, has been applied to the wafer 200. As can be seen in the left side portion 202a, the opening in the photoresist 208 is wider than the width of the via opening. In contrast, in the right side portion 202b, the opening in the photoresist 208 is narrower than the width of the via opening. As a result, two different effects can be achieved.

FIG. 2B illustrates the two portions 202a, 202b after the vias have been plated with metal 210. As can be seen, due to the disparity between the two openings in the photoresist 208, the metal 210 in the left portion 202a has formed an upraised dished configuration, whereas the metal 210 on the left portion 202b has formed a narrow "pillar" shape.

FIG. 2C illustrates the two portions 202a, 202b after the seed 204 and metal 210 have been reduced by the thickness of the seed 204. Advantageously, it will be appreciated that the portion 202a on the left now has a standoff or base for a "well" structure, whereas the portion 202b has a standoff or base for a "post" structure. Thus, it should be appreciated that, by choosing the right metals, some implementations of the approaches described herein are well suited for use in forming contacts for use with post and penetration, well attach or both techniques.

When using the approach for the formation of part of a post for a post and penetration process, by making the opening in the photoresist 208 smaller than the via opening we can ensure that later steps which may be performed to connect the via to metal traces on the surface can happen without having to remove a large amount of overburden.

Note that, although it may be desirable, it will generally be difficult to exactly match the opening of the photoresist 208 to the via opening. As a result, unless the effect of using a wider opening is desired, it is expected that the typical course will be to have the opening of the photoresist 208 be smaller than the opening of the via.

At this point it should be understood that by using a photoresist, such as Riston, or some other patterning material that does not flow into vias (or if it does flow does not flow significantly deep into the vias) on the wafer after seed deposition, at least one of three distinct and different advantages can be achieved in some implementations:

1. a reroute layer can be plated on the surface of the die at the same time as the via is filled, saving mask steps;

2. if the opening of the photo resist is smaller than the via opening it can prevent overburden deposition entirely; and 3. by proper selection of the opening of the photo resist one can automatically create a structure suitable for use in a post and penetration process.

In yet another variant, we can use pre-patterning to etch down to a pad, device or device contact in areas that would ordinarily be covered during the insulator deposition. This pattering and etch can happen either before the seed deposition occurs (in which case the seed will cover the openings) or after the seed deposition occurs (in which case the seed will not cover the openings). In the latter case, subsequent plating would allow overburden to grow laterally and connect places where seed still remained exposed.

Subsequently, another patterning could be used to preferentially connect the via to the, for example, pads by using the overburden directly. In this manner, a two-dimensional patterned contact can be automatically formed by patterning the locations of the overburden.

FIGS. 3A through 3R illustrate, in simplified cross section and top view, a more complicated variant of the approach and its effect in order to form an unconventional contact arrangement or geometry. Here too, scale has been distorted for purposes of presentation.

FIG. 3A is a side view of a portion 300 of a wafer 302 in the area of a contact pad 304. A portion 306 of the contact pad 304 is accessible through an opening 308, in this case square in shape, in the cover glass 310. FIG. 3B is a top view of the portion 300 of FIG. 3A.

FIG. 3C is a side view of the portion 300 of FIG. 3A after a via 312, in this case circular in shape, has been formed in the wafer 302 through the contact pad 304. FIG. 3D is a top view of the portion of FIG. 3C.

FIG. 3E is a side view of the portion of FIG. 3C after an insulator layer 314 has been deposited on the portion 300 using a conventional insulator application process. FIG. 3F is a top view of the portion of FIG. 3E.

FIG. 3G is a side view of the portion of FIG. 3E after a "solid" photoresist 316 has been applied to the portion 300. As shown, the photoresist 316 completely covers the via 312 and has two small square openings 318a, 318b. FIG. 3H is a top view of the portion of FIG. 3G.

FIG. 3I is a side view of the portion of FIG. 3G after a pattern etch has been performed to expose and provide access to the contact pad 304 via the openings 318a, 318b and the photoresist has been removed. FIG. 3J is a top view of the portion of FIG. 3I.

FIG. 3K is a side view of the portion of FIG. 3I after deposition of a seed layer 320. FIG. 3L is a top view of the portion of FIG. 3K.

FIG. 3M is a side view of the portion of FIG. 3K after a new photoresist 322 has been applied. Depending upon the particular implementation and desired result, this second photoresist 322 can be a "solid" photoresist or can be a conventional flowable photoresist. As shown, the photoresist is a solid photoresist configured such that a form of keyhole shape is created (although virtually any shape could be used as desired). FIG. 3N is a top view of the portion of FIG. 3M.

FIG. 3O is a side view of the portion of FIG. 3M immediately after metal 324 has filled the via and built up within the photoresist 322 during plating. FIG. 3P and FIG. 3Q are, respectively, side and top views, of the result of the plating after removal of the photoresist 322.

FIG. 3R is a side view of the portion of FIG. 3P after a conventional seed etch has been performed on the portion. As with the prior example, the seed etch is performed without protecting the metal 324 of the newly formed contact (i.e. they are both concurrently etched). While this results in a reduction in height of the contact, such reduction is only by the thickness of the seed layer which is many times smaller than the height of the contact and, thus, causes no adverse effects.

FIGS. 4A through 4M illustrate, in simplified cross section and top view, another variant of the approach and its effect. Here too, scale has been distorted for purposes of presentation. In this example, a contact will be created having a standoff for a "post" that is usable in a post and penetration connection formed on one end and a base for a capacitive through-chip connection is formed on the other end.

FIG. 4A is a side view of a portion 400 of a wafer 402 in the area of a contact pad 404. A portion 406 of the contact pad 404 is accessible through an opening 408 in the cover glass 410. FIG. 4B is a top view of the portion 400 of FIG. 4A.

FIG. 4C is a side view of the portion 400 of FIG. 4A after a via 412 has been formed in the wafer 402 through the contact pad 404. FIG. 3D is a top view of the portion of FIG. 4C.

FIG. 4E is a side view of the portion of FIG. 4C after an insulator layer 414 has been deposited on the portion 400, using a conventional insulator application process, to isolate it from the contact pad 404. FIG. 4F is a top view of the portion of FIG. 4E.

FIG. 4G is a side view of the portion of FIG. 4E after deposition of a seed layer 418. FIG. 4H is a top view of the portion of FIG. 4G.

FIG. 4I is a side view of the portion of FIG. 4G after a "solid" photoresist 420 has been applied to the portion 400. As shown, the photoresist 420 has a circular opening that is smaller in diameter than the diameter of the via 412 and, thus, overhangs the periphery of the via opening. FIG. 4J is a top view of the portion of FIG. 4I.

FIG. 4K is a side view of the portion of FIG. 4I after plating has occurred so that the via 412 and the opening of the photoresist 420 is filled by metal 422.

FIG. 4L is a side view of the portion of FIG. 4K after removal of the photoresist 420. Note that the "overburden" of the plating metal 422 has formed a standoff or post above the seed layer 418.

FIG. 4M is a side view of the portion of FIG. 4L after removal of the seed layer 418 via a conventional seed etch process, such as a chemical-mechanical process. Here, the seed etch has been performed without protecting the plated metal (i.e. the seed etch was performed on the both the seed layer 418 that was exposed by removal of the photoresist 420 and the plated metal 422 until the exposed seed layer 418 was removed, thereby reducing the height of the plating metal 418 by about the thickness of the seed layer 418.

Thus, from the above, it can now be appreciated that the techniques described herein are versatile and, in different implementations, reduce cost by allowing for elimination of processing steps relative to processes that use masking to apply a seed layer to only desired areas or reducing the number of steps needed to deal with undesirable overburden, or both.

Although it has not been expressly described, it should be understood that the approach is intended fro use with any seed layer and plating metal combination that could be used in the prior art, the specific selection of each being a function of the intended usage, not the invention, which is essentially independent of the specific metals. Of course, it should be recognized that the particular selection of metals for the seed layer and plating may impact the type and kind of "solid" photoresist used.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A methods comprising:
    depositing a seed layer onto a wafer;
    forming a patterned resist on top of the seed layer, wherein the patterned resist has one or more openings exposing at least one portion of the seed layer, and wherein the patterned resist overhangs at least a part of a via;
    plating the exposed at least one portion of the seed layer with a layer of metal, wherein the layer of metal extends above an upper surface of the seed layer;
    removing the resist; and
    removing at least one portion of the seed layer that was exposed by said removing the resist.

2. The method of claim 1, wherein said plating the exposed at least one portion of the seed layer comprises performing an electroless plating process on the exposed of the seed layer.

3. The method of claim 1 wherein said plating the exposed at least one portion of the seed layer with a layer of metal comprises performing an electroplating process on the exposed at least one portion of the seed layer.

4. The method of claim 1, wherein said removing at least one portion of the seed layer comprises concurrently etching away the exposed at least one portion of the seed layer and the layer of metal until the height of the layer of metal is reduced by at least the thickness of the seed layer.

5. The method of claim 1, wherein the patterned resist defines at least one opening configured to define at least a portion of an integrated circuit path along a surface of the wafer.

6. The method of claim 1, wherein the patterned resist defines at least one opening configured to define a post-like standoff.

7. The method of claim 1, wherein a via is formed in the wafer, wherein the seed layer is deposited in the via, and wherein the openings in the resist are located at least partially over the via.

8. The method of claim 7, wherein the patterned resist is a solid resist that is configured to cover at least a portion of the opening of the via.

9. The method of claim 7, wherein a portion of the layer of metal extends beyond the opening of the via and is configured to provide a routing trace.

10. The method of claim 1, further comprising depositing an insulator on the wafer prior to depositing the seed layer.

11. The method of claim 1, wherein the resist is a solid resist.

12. The method of claim 1, wherein said removing the resist comprises exposing a side portion of the layer of metal.

13. A method, comprising:
    patterning a resist that is located on a seed layer of a wafer to expose at least one portion of the seed layer and to overhang at least a part of a via;
    plating the at least one exposed portion of the seed layer with a layer of metal, wherein the layer of metal extends above an upper surface of the seed layer;
    removing the resist; and
    subsequently removing the at least one exposed portion of the seed layer and at least a portion of the metal layer.

14. The method of claim 13, wherein said plating the at least one exposed portion of the seed layer comprises performing an electroless plating process on the at least one exposed portion of the seed layer.

15. The method of claim 13, wherein said plating the at least one exposed portion of the seed layer comprises performing an electroplating process on the at least one exposed portion of the seed layer.

16. The method of claim 13, wherein a via is formed in the wafer, and wherein the at least one exposed portion of the seed layer is located in the via.

17. The method of claim 13, wherein said removing at least a portion of the metal layer comprises reducing the thickness of the metal layer by an amount at least equal to the thickness of the seed layer.

18. The method of claim 13, wherein the resist is patterned to define at least one opening configured to define at least a portion of an integrated circuit path along a surface of the wafer.

19. The method of claim 13, wherein the resist is patterned to define at least one opening configured to define a post-like standoff.

20. The method of claim 13, wherein the resist is a solid resist.

* * * * *

UNITED STATES PATENT AND TRADEMARK OFFICE
CERTIFICATE OF CORRECTION

PATENT NO. : 7,598,163 B2　　　　　　　　　　　　　　　　　　　　Page 1 of 1
APPLICATION NO. : 11/675268
DATED : October 6, 2009
INVENTOR(S) : John Callahan et al.

It is certified that error appears in the above-identified patent and that said Letters Patent is hereby corrected as shown below:

IN THE SPECIFICATION:

Under "BRIEF DESCRIPTION OF THE DRAWINGS"

col. 2, lines 28, 29:

Delete the following sentence:

"This invention relates to capacitive sensors and, more particularly, to capacitive sensors for use in fingerprint detection."

Under "DETAILED DESCRIPTION"

col. 3, line 57:

Delete "104a" and replace with --104b--.

col. 4, line 37:

Delete "left" and replace with --right--.

IN THE CLAIMS:

Claim 1 col. 7, line 20:

Delete "methods" and replace with --method--.

Signed and Sealed this

Twenty-fourth Day of November, 2009

David J. Kappos
*Director of the United States Patent and Trademark Office*